United States Patent [19]
Halliday et al.

[11] Patent Number: 6,147,485
[45] Date of Patent: Nov. 14, 2000

[54] UNIVERSAL TEST FIXTURE FOR CIRCUIT PACKS

[75] Inventors: Thomas A. Halliday, Ocean; Robert Emmett Warren, Warren; Dany Maroun Zeidan, Howell, all of N.J.

[73] Assignee: Lucent Technologies Inc., Murray Hill, N.J.

[21] Appl. No.: 09/027,634

[22] Filed: Feb. 23, 1998

[51] Int. Cl.⁷ .................................................. G01R 31/02
[52] U.S. Cl. .......................... 324/158.1; 324/754; 439/61; 439/377
[58] Field of Search .............................. 324/158.1, 73.1, 324/754, 72.5; 439/61, 62, 59, 377; 361/788

[56] References Cited

U.S. PATENT DOCUMENTS

| | | | |
|---|---|---|---|
| 4,702,535 | 10/1987 | Beun | 312/308 |
| 4,810,956 | 3/1989 | Hvezda et al. | 324/754 |
| 5,769,644 | 6/1998 | Murphy et al. | 439/61 |
| 5,854,904 | 12/1998 | Brown | 395/280 |

*Primary Examiner*—Safet Metjahic
*Assistant Examiner*—T. R. Sundaram

*Attorney, Agent, or Firm*—Gibbons, Del Deo, Dolan, Griffinger & Vecchione

[57] ABSTRACT

A universal test fixture assembly for circuit packs includes a test fixture body, a top guide plate and a bottom guide plate. Each guide plate includes tracks that extend from a front end to a second end of the guide plates and further includes an integrally formed latching channel that runs perpendicular to the tracks. The top guide plate and bottom guide plate are mounted in an opposing and matching relationship such that the circuit pack slidably engages one of the tracks in the top guide plate and a corresponding track in the bottom guide plate and are moveable relative to one another to accommodate circuit packs of varying sizes. The guide plates include tabs which mate with corresponding slots on the test fixture body to prevent misalignment and reduce tolerance build-ups. A second pair of guide plates are attachable to form a two-tiered structure such that two different circuit pack sizes can be accommodated in the same test fixture. The test fixture assembly uses offset mounting ears so that multiple test fixtures can be stacked together in various combinations and such that a single backplane can be used that spans all of the connected test fixtures. A polycarbonate cover is attachable to the offset mounting ears to protect the backplane and the associated pins and connectors.

23 Claims, 15 Drawing Sheets

FIG. 11A
FIG. 11B
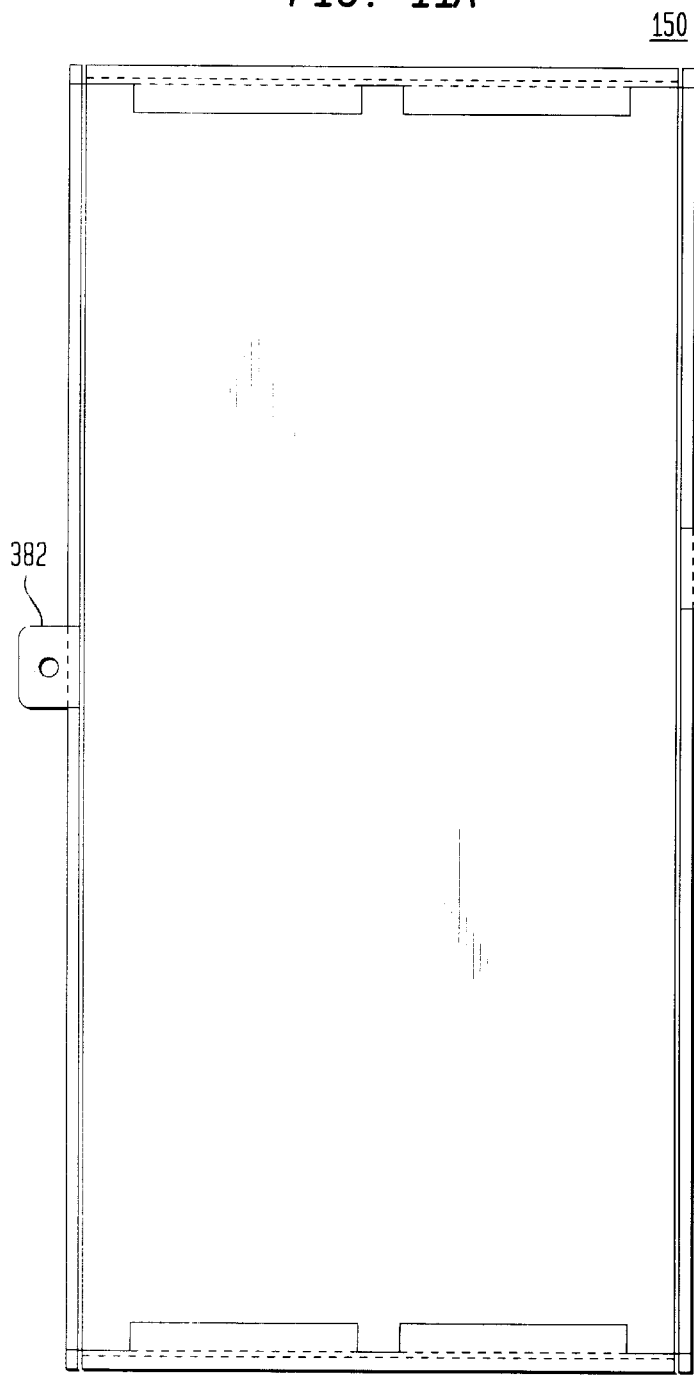
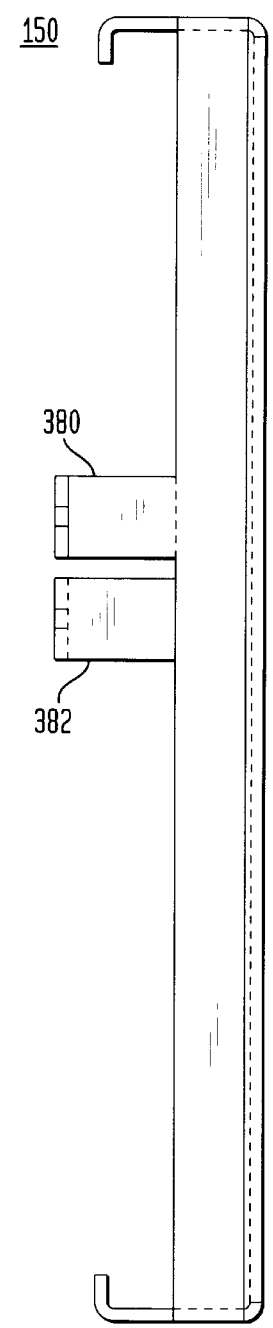

UNIVERSAL TEST FIXTURE FOR CIRCUIT PACKS

FIELD OF THE INVENTION

This invention relates to a fixture design for testing of circuit packs, and in particular, to a universal fixture which accommodates the housing and testing of different size circuit packs during the development cycle.

BACKGROUND OF THE INVENTION

As a specific technology evolves and the related industry matures, the equipment used to implement the technology often converges toward a standard metric. That is, certain aspects of the equipment, such as the size of circuit packs, for example, or the type and layout of their connectors become standardized. In the telecommunications industry, strong efforts have been made toward standardization of equipment, including the development of a standard for circuit packs in certain companies. For example, at Lucent Technologies Inc., circuit packs comply with a OneNS height/depth/connector standards.

A circuit pack is an assemblage of various electronic and/or optical components which are mounted on a printed wiring board (PWB) with an edgeboard connector to allow it to interface with a PWB backplane. Usually, a backplane interconnects each circuit pack to other circuit packs, or to cables or both.

In general, evaluation and testing of a circuit pack during the design phase is achieved by connecting it to test equipment or other circuit packs using cables or a prototype backplane design. Frequently, a frame of equipment comprised of a multiplicity of shelves each having its own backplane, has been used as the interface for design testing. Another typical approach is to design a custom test fixture mounting with a specialized backplane for each circuit pack. This approach has the distinct disadvantage of being usable only with circuit packs that have the same physical characteristics and, therefore, circuit packs of a different size can not be readily evaluated without the construction of another specialized test fixture. Accordingly, known mounting assemblies for testing individual circuit packs are cumbersome and difficult to use, inefficient to make, costly to fabricate and maintain, and time-consuming since they increase circuit pack development intervals.

SUMMARY OF THE INVENTION

The present invention is a universal test fixture assembly that permits facile installation, for testing purposes, of different size circuit packs. The assembly is comprised of a sheet metal chassis and of a generic pinned backplane for cable connections which accommodates either individual or interconnected circuit pack testing. Importantly, the present invention accommodates different spacing between the circuit packs by utilizing removable guide (and locking) plates which allow relatively wide or tall circuit packs to be easily accommodated. This results in increased portability and reusability between multiple projects and applications.

In an exemplary embodiment of the present device, a test fixture assembly for circuit packs includes a test fixture body, a top guide plate and a bottom guide plate. Each guide plate includes tracks that extend from a front end to a second end of the guide plates and an integrally formed latching channel that runs perpendicular to the tracks. The top guide plate and bottom guide plate are mounted in an opposing and matching relationship such that the circuit pack slidably engages one of the tracks in the top guide plate and a corresponding track in the bottom guide plate. Importantly, the guide plates include tabs which mate with corresponding slots on the test fixture body to prevent misalignment and reduce tolerance build-ups. A second pair of guide plates are attachable to form a two-tiered structure such that two different circuit pack sizes can be accommodated in the same test fixture.

The universal test fixture of this invention has the following innovative design features:

The test fixture accommodates different spacing between circuit packs by utilizing removable guide plates. It can mount circuit packs whose widths totals up to six inches.

The test fixture is side-to-side stackable so the inter-operation of circuit packs whose width totals more than six inches can be accommodated by fastening multiple test fixtures together using their mounting flanges. A single custom backplane can be designed that spans these stacked test fixtures.

The test fixture accommodates different height circuit packs. Internal to Lucent Technologies, Inc., the test fixture complies with the OneNS circuit pack height/depth/connector standard. The specific test fixture design detailed in this presentation corresponds to the three standard circuit pack arrangements called 1N, 1.5N and 3N which refers to the height dimension of this standard. Any one of these standard sizes can be used in each test fixture. For other internal or external arrangements of circuit pack height, the test fixture design can be simply modified to a different height by revising a few primary dimensions in the drawings.

The test fixture is easily modifiable to different depth and connector configurations for circuit packs. For other internal or external standards other than the OneNS standard, the circuit pack depth can be simply revised by adjusting a few primary dimensions in the drawing and the connector type can be revised by swapping the backplane mounting pattern arrangement for the connector.

The test fixture utilizes slot and tab construction to reduce tolerance buildup and increase alignment accuracy.

The test fixture has open sides to allow access to the components to facilitate the debugging of the circuit packs during powered operation.

The test fixture mounting flanges allow it to mount on any 1-inch-vertical hole-to-hole-spaced frame or cabinet so newly developed circuit packs can be tested together with existing products.

The test fixture finish, and fasteners in their mounting flanges, allow direct and robust ground connections.

The test fixture allows the mounting of different industry-standard physical interfaces, such as RS-232 and 10 Base T connectors, to communicate with the circuit pack under test.

The test fixture may be used as an electrostatic-discharge (ESD) protective container for transporting circuit packs between locations or rooms.

Advantageously, the device of the present invention utilizes formed sheet metal guide plates with integrated latching channels to reduce the number of individual pieces. A polycarbonate cover is attachable to the offset mounting ears to protect the backplane and the associated pins and connectors. The above factors make the present invention a versatile and efficient fixture for testing circuit packs.

BRIEF DESCRIPTION OF THE DRAWINGS

A more complete understanding of the present invention may be obtained from consideration of the following description in conjunction with the drawings in which:

FIGS. 9A, 9B, 9C and 9D are front, side and specified enlarged views of the bottom guide plate as shown in FIGS. 8A and 8B;

FIGS. 11A, and 11B are front, and side views of the cover bracket as shown in FIG. 10;

DETAILED DESCRIPTION

Figure 1:
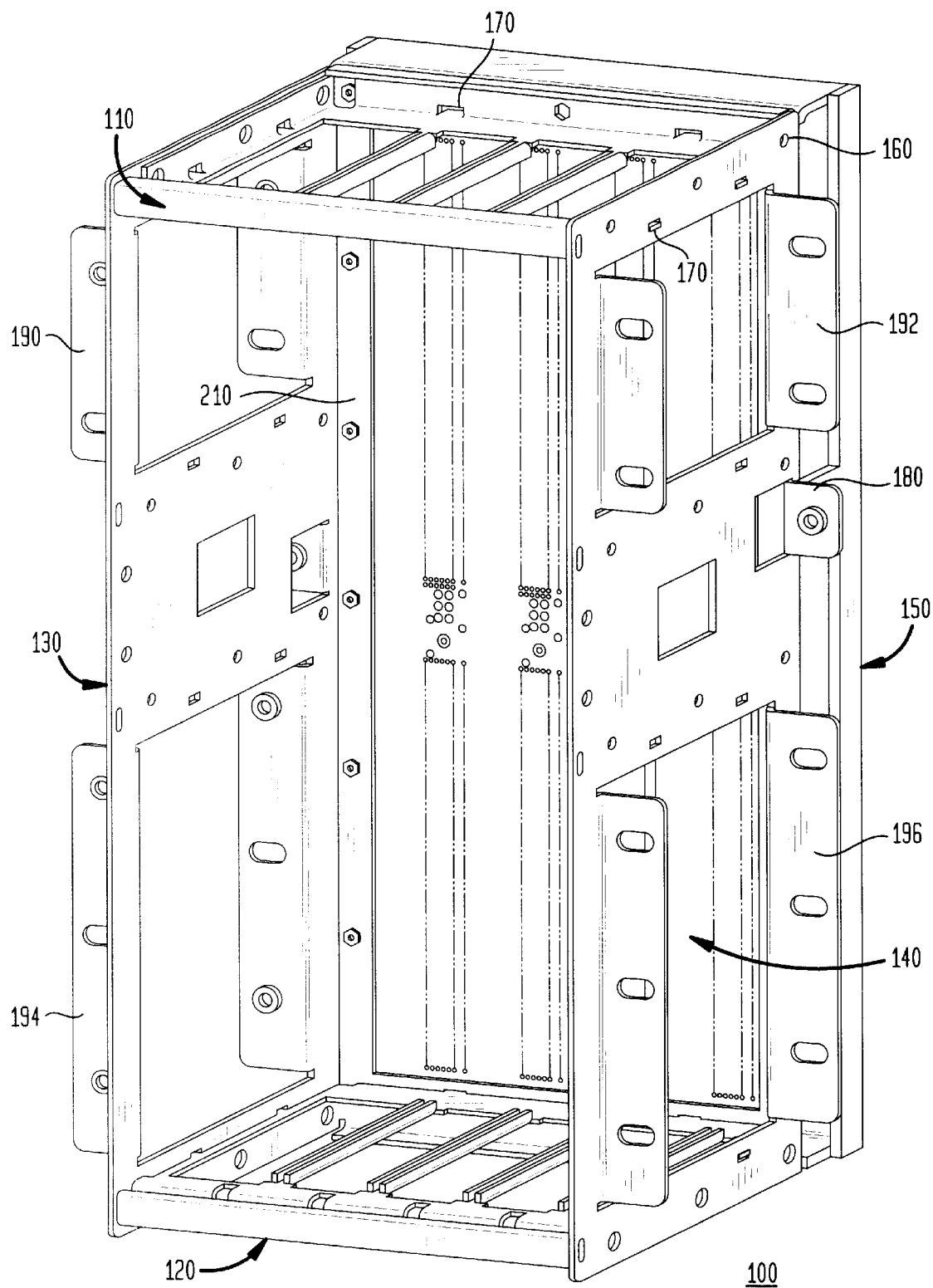
FIG. 1 is a perspective view of an exemplary embodiment of a test fixture for a 3N size circuit pack in accordance with the present invention.

As a specific technology evolves and the related industry matures, the equipment used to implement the technology converges toward a standard metric. That is, certain aspects of the equipment, such as the size of circuit packs and the type and layout of their connectors, become standardized. Standards have evolved for circuit packs used in the telecommunications industry. Internal to Lucent Technologies, Inc., the test fixture complies with the OneNS circuit pack height/depth/connector standard. In accordance with that standard, circuit packs are designated as 1N, 1.5N, 3N which refers to the height dimension of the circuit pack. The depth dimension of this standard typically remains fixed at a given value. In addition, the circuit packs use standard configurations of 2-mm-grid connectors for connection between the circuit packs and backplane.

The present invention is a test fixture which accommodates different height circuit packs. The specific test fixture design detailed in this presentation corresponds to the three standard circuit pack arrangements called 1N, 1.5N and 3N. Any one of these standard sizes can be used in each test fixture. For other internal or external arrangements of circuit pack height, the test fixture design can be simply modified to a different height by revising a few primary dimensions in the drawings.

The test fixture is easily modifiable to different depth and connector configurations for circuit packs. For other internal or external standards other than the OneNS standard, the circuit pack depth can be simply revised by adjusting a few primary dimensions in the drawing and the connector type can be revised by swapping the backplane mounting pattern arrangement for the connector.

Referring to FIG. 1, there is shown an exemplary embodiment of a test fixture 100 for a 3N circuit pack size. Test fixture 100 includes a top guide plate 110, a bottom guide plate 120, a test fixture body 130, a backplane 140 and a cover bracket 150. Test fixture 100 further includes cover mounting ears 180 and 182 and test fixture mounting ears 190, 192, 194 and 196. An overall description is first presented, followed by a description of the individual parts. In general, tabs and slots are used to align top guide plate 110 and bottom guide plate 120 with test fixture body 130. After alignment, screws 160 are used to attach top guide plate 110 and bottom guide plate 120 to test fixture body 130. Use of slot and tab construction increases accuracy and reduces tolerance build-up in test fixture 100.

Figure 2:
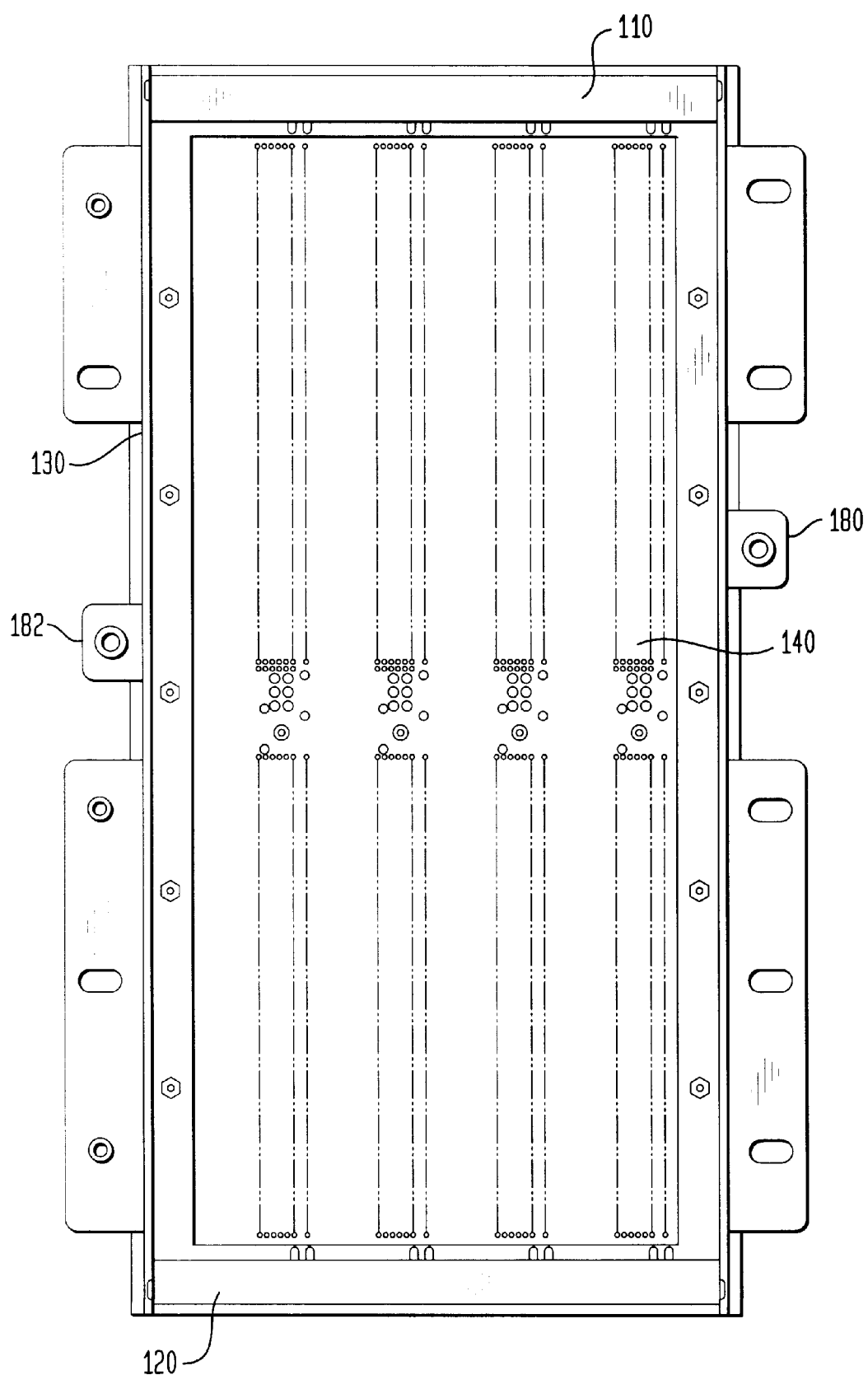
FIG. 2 is a front view of the exemplary embodiment shown in FIG. 1.
Figure 3:
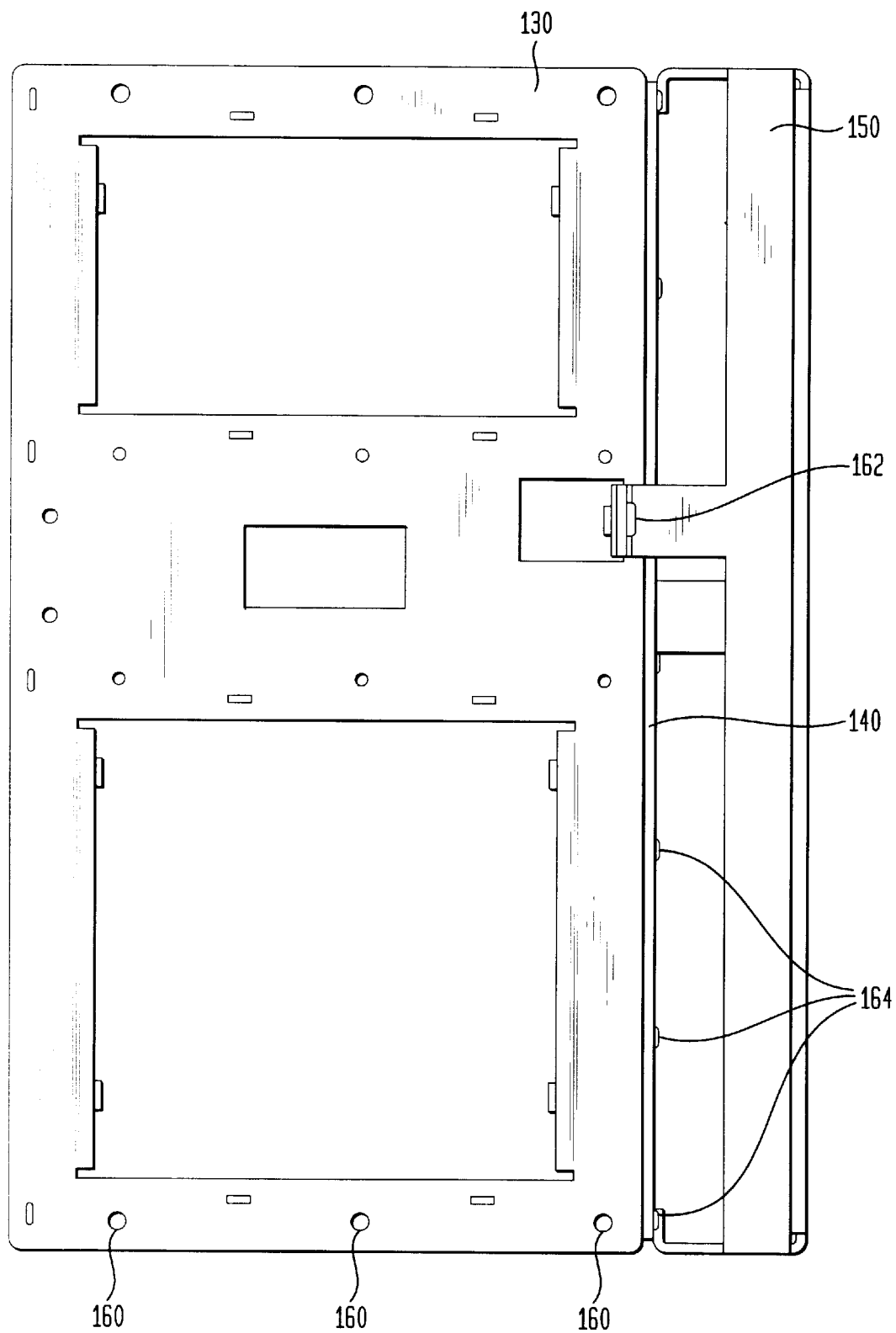
FIG. 3 is a side view of the exemplary embodiment shown in FIG. 1.

Referring also to FIGS. 2 and 3, cover mounting ears 180 and 182 are vertically offset to allow stacking of multiple test fixtures in various combinations. Although each test fixture holds multiple circuit packs, this stackability allows the test engineer to test more circuit packs with the use of only one backplane. That is, the stackability permits the test engineer to use one backplane spanning a set of attached test fixtures instead of requiring multiple backplanes. Specifically, the test fixture is side-to-side stackable so the interoperation of circuit packs whose width totals more than 6 inches can be accommodated by fastening multiple test fixtures together using their mounting flanges and using a single custom backplane that spans the stacked test fixtures. This results in easier operation and decreased costs. As shown in FIGS. 1–3, cover bracket 150 is attached to test fixture body 130 using cover mounting ears 180 and 182 and screws 162 and backplane 140 is attached to a back section 210 of test fixture body 130 using screws 164.

Figure 4:
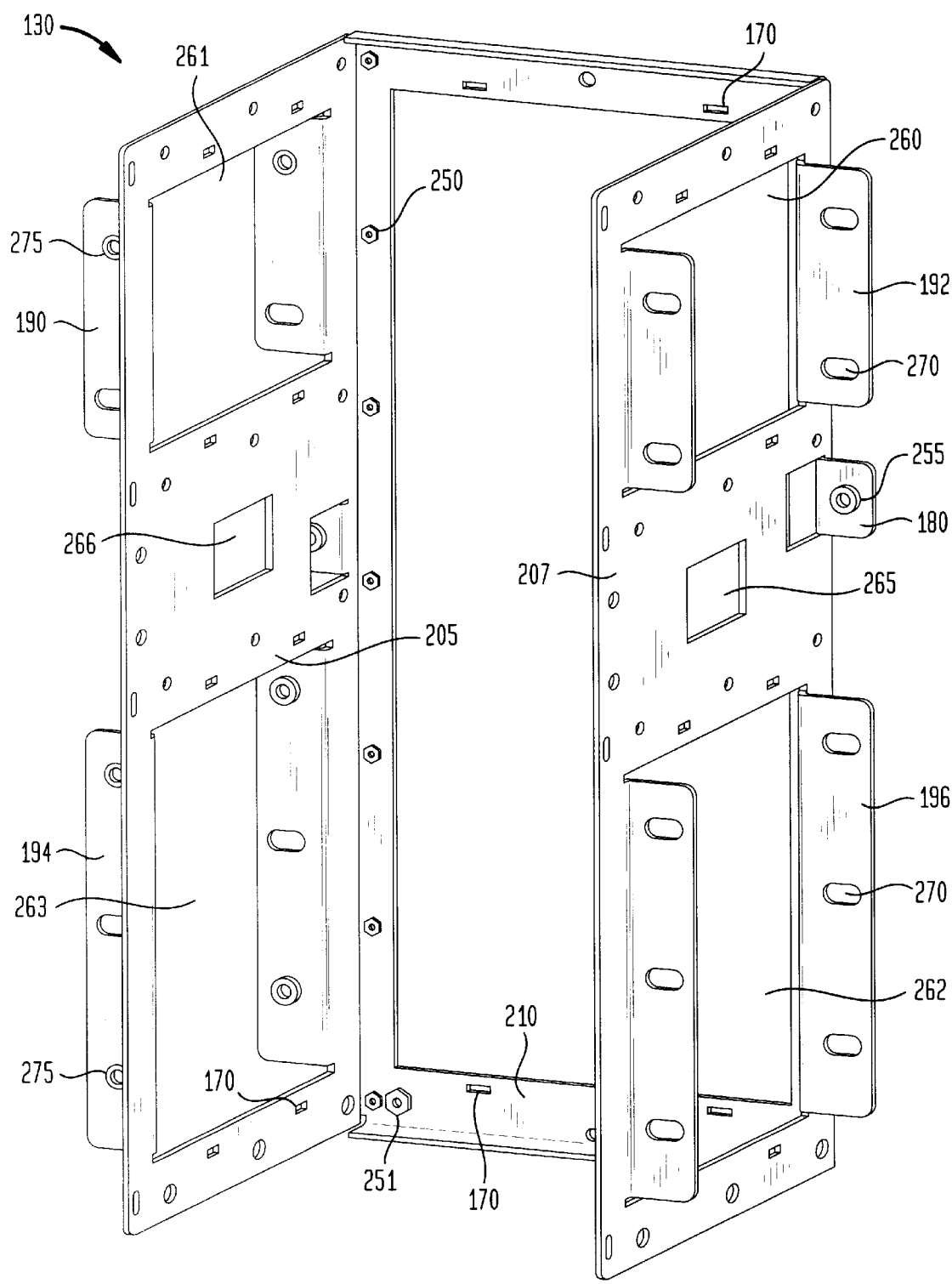
FIG. 4 is a perspective view of an exemplary embodiment of a test fixture body for a 3N circuit pack in accordance with the present invention.

Referring now to FIG. 4, there is shown a test fixture body 130 in a standalone view. Features identified earlier are identically numbered in FIG. 4. Test fixture body 130 is a substantially rectangular housing that has a first side section 205, a second side section 207, and a back section 210 connecting first side section 205 to second side section 207. First side section 205, second side section 207, and a back section include slots 170 to permit accurate alignment of top guide plate 110 and bottom guide plate 120. Proper alignment decreases the chances of bent pins when placing the circuit packs into test fixture 100.

Figure 5:
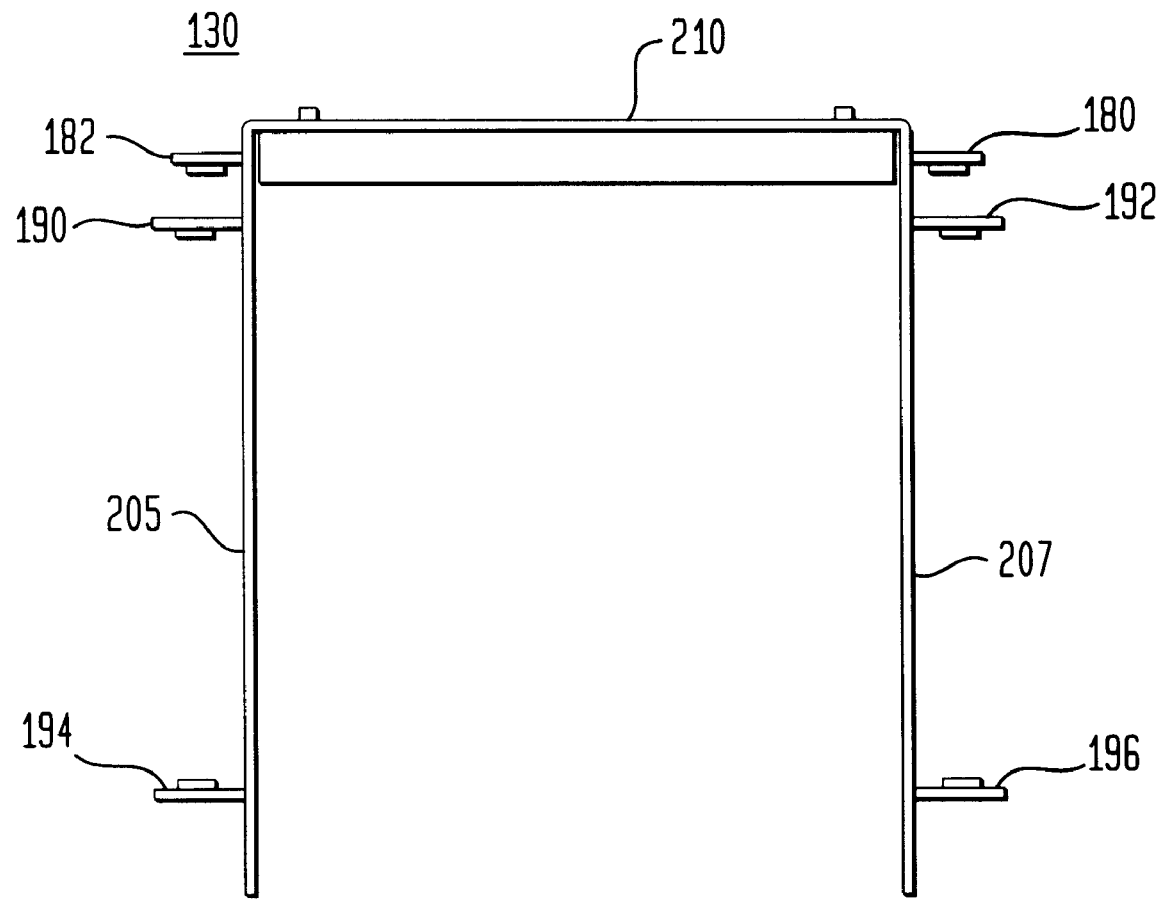
FIG. 5 is a top view of the exemplary embodiment shown in FIG. 4.

As stated above, cover mounting ears 180 and 182 are in a vertically offset relationship with respect to each other. Cover mounting ears 180 and 182 extend outwardly and perpendicularly from first side section 205 and second side section 207, respectively. Cover mounting ears 180 and 182 include self-clinching nuts 255 for attaching cover bracket 150. Test fixture mounting ears 192, 196, 190 and 194 also extend outwardly and perpendicular from first side section 205 and second side section 207, respectively. Test fixture mounting ears 192 and 196 have oval shaped openings 270 to provide side-to-side stackability when stacking multiple test fixtures. Nuts 275 in test fixture mounting ears 190 and 194 are then used to lock the multiple test fixtures together once an arrangement has been determined. The physical relationship between cover mounting ears 180 and 182 and test fixture mounting ears 190, 192, 194 and 196 is best illustrated in FIG. 5, which is a top view of test fixture body 130. Moreover, the test fixture mounting flanges allow it to mount on any 1-inch-vertical-to-hole-spaced frame or cabinet so newly developed circuit packs can be tested together with existing products.

Referring back to FIG. 4, first side section 205 and second side section 207 further include openings 266 and 265 to attach fiber-optic cables and other such equipment. Openings 261, 263 and 260, 262 provide access to the circuit packs so that the design engineer, or operator, can replace parts on the circuit pack and/or attach test probes without having to remove the circuit pack from test fixture 100. That is, the openings permit access to the components to facilitate the debugging of the circuit packs during powered operation. Back section 210 includes self-clinching flush fasteners 250 and self-clinching standoffs 251 for attaching backplane 140 to test fixture body 130.

Figure 6:
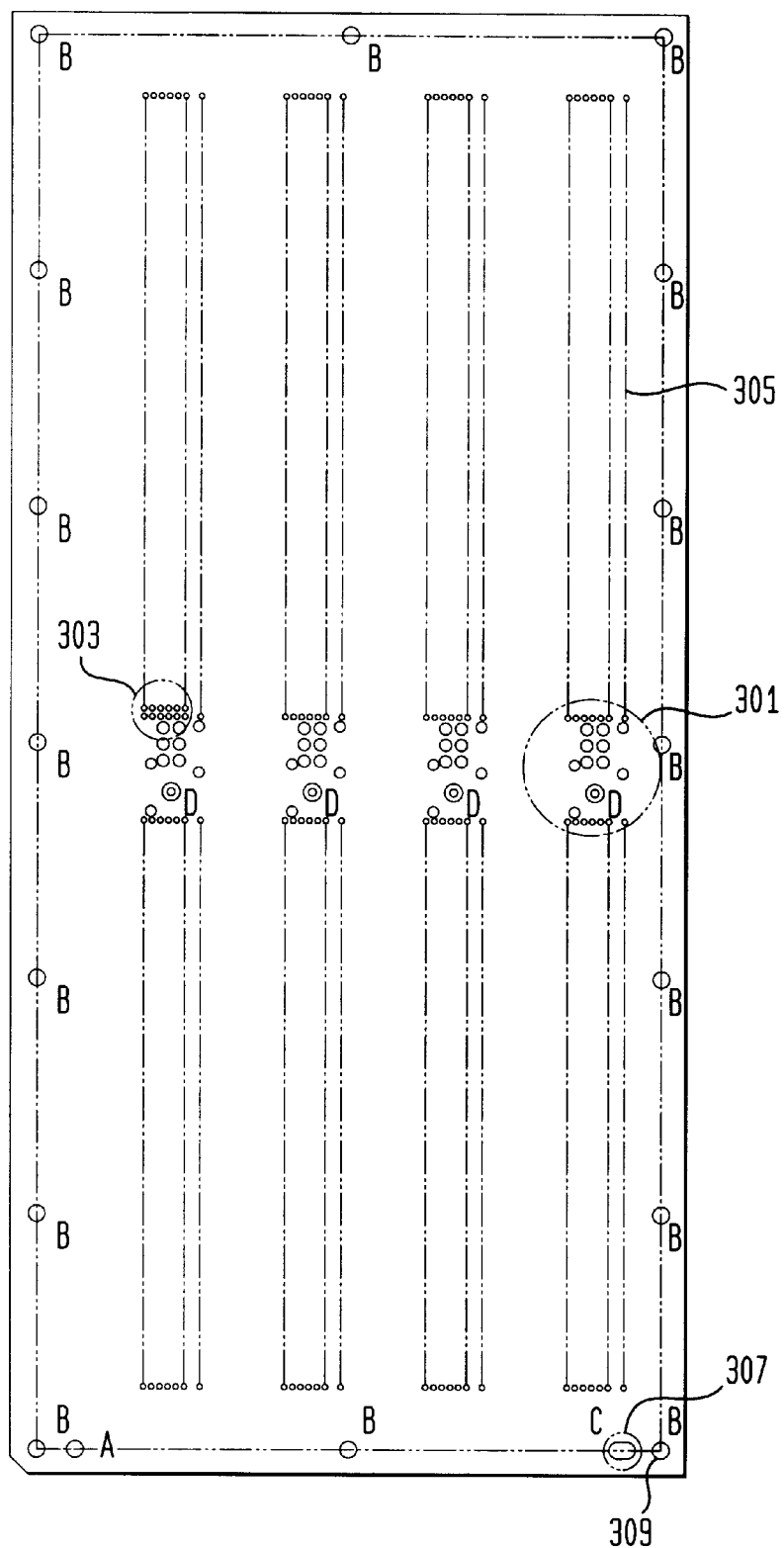
FIG. 6 is a front view of an exemplary embodiment of a backplane for a 3N circuit pack in accordance with the present invention.
Figure 7A:
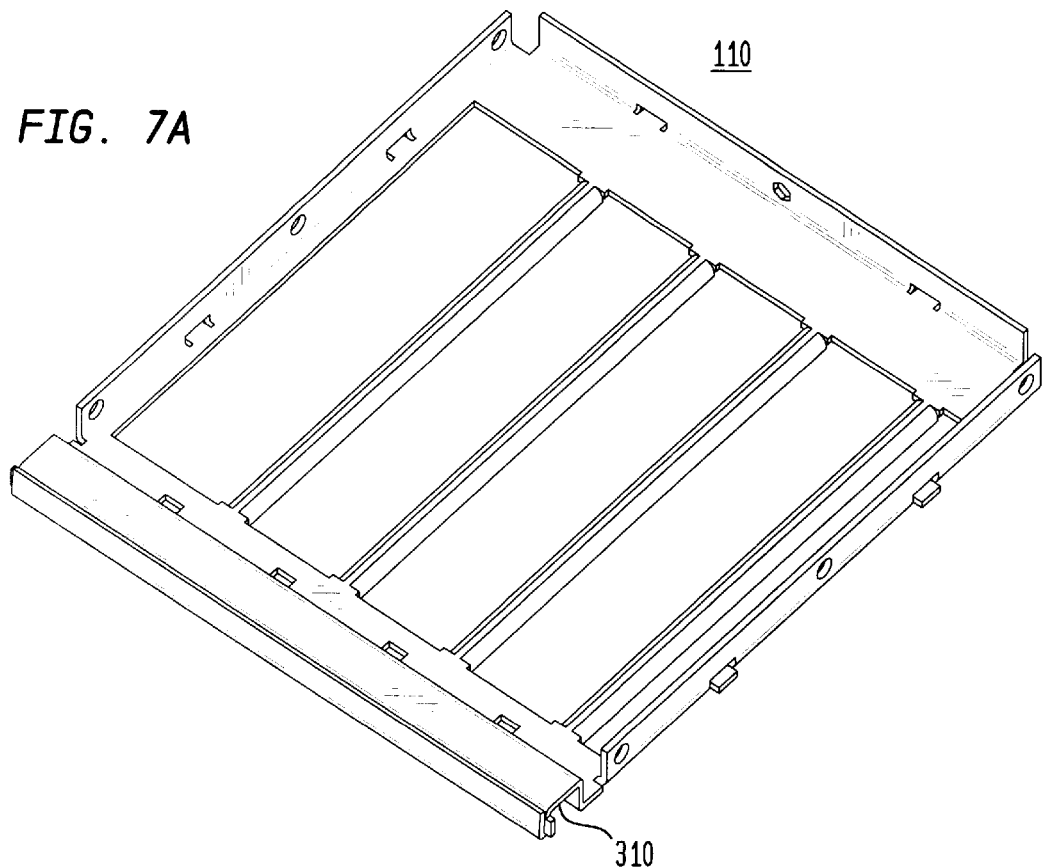
FIGS. 7A and 7B are perspective views of an exemplary embodiment of a top guide plate in accordance with the present invention (for 1N/1.5N/3N)
Figure 7B:
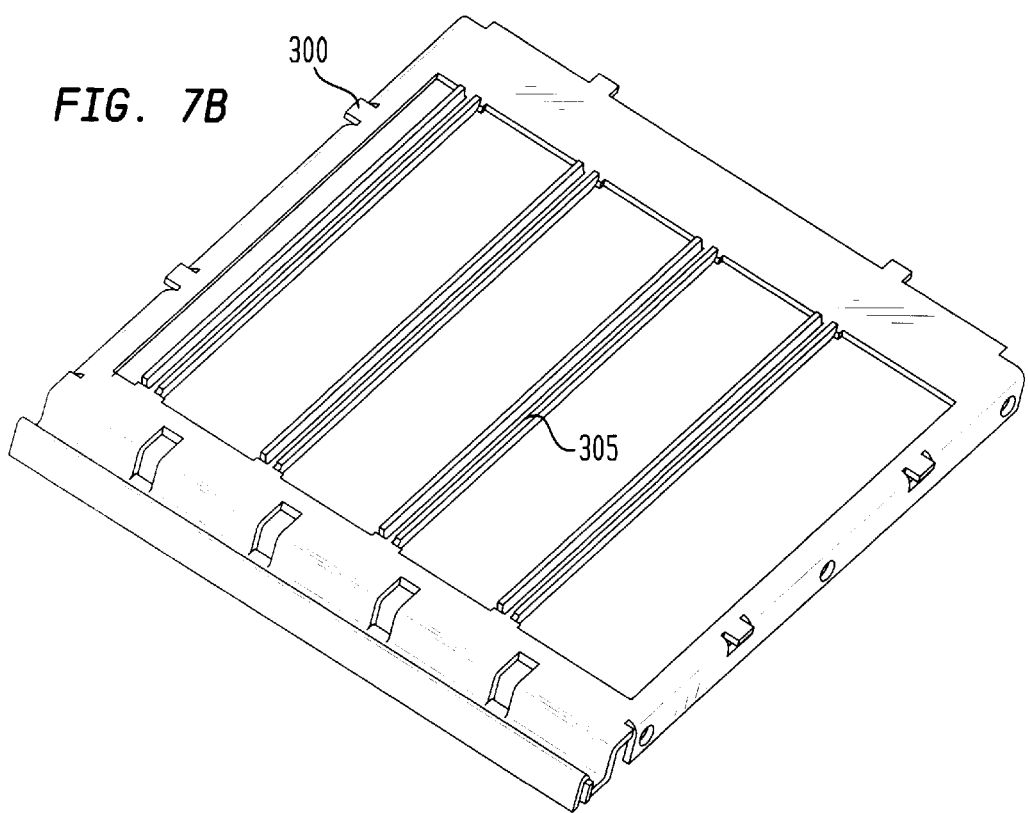

Referring now to FIG. 6, an exemplary embodiment of backplane 140 is shown for the 3N circuit pack. Backplane 140 is populated, in a columnar manner, with a plurality of METRAL® type connectors for connection with the circuit packs and the fiber-optic cables. As would be known to one skilled in the art, connectors 301 are keying and alignment pin fields, connectors 303 are single pin fields and connectors 305 are the shield terminator pin fields. Nut 307 permits side-to-side slackability when aligning backplane 140 with test fixture body 130. Once aligned, nut 309 permits the locking of backplane 140 into the required position.

Referring now to FIGS. 7A, 7B and 8A, 8B, a top guide plate 110 and a bottom guide plate 120 are shown, respectively. Top guide plate 110 and a bottom guide plate 120 are substantially flat, rectangular constructs on which the circuit packs are slid onto and positioned. Top guide plate 110 and bottom guide plate 120 are mirror images of each other and results in added cost savings and decreased tolerance build-ups. As a consequence of this design, the detailed discussion of the features of both are made with reference to bottom guide plate 120.

Figure 8A:
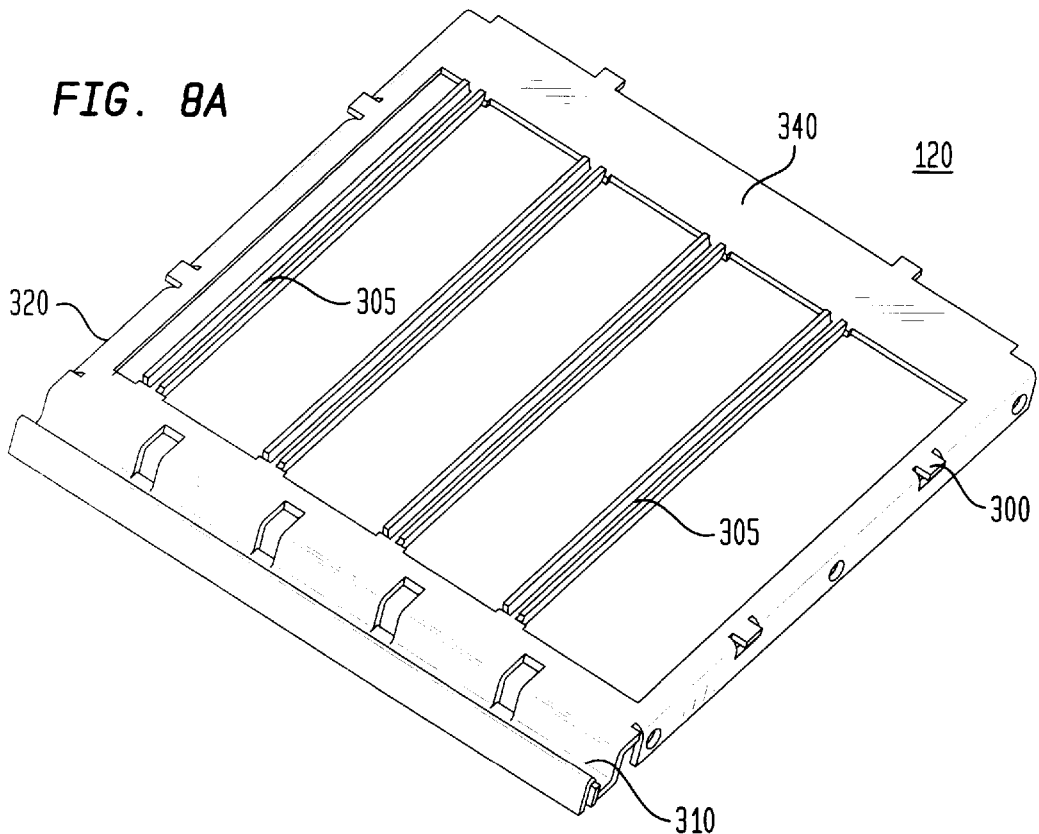
FIGS. 8A and 8B are perspective views of an exemplary embodiment of a bottom guide plate in accordance with the present invention (for 1N/1.5N/3N)
Figure 8B:
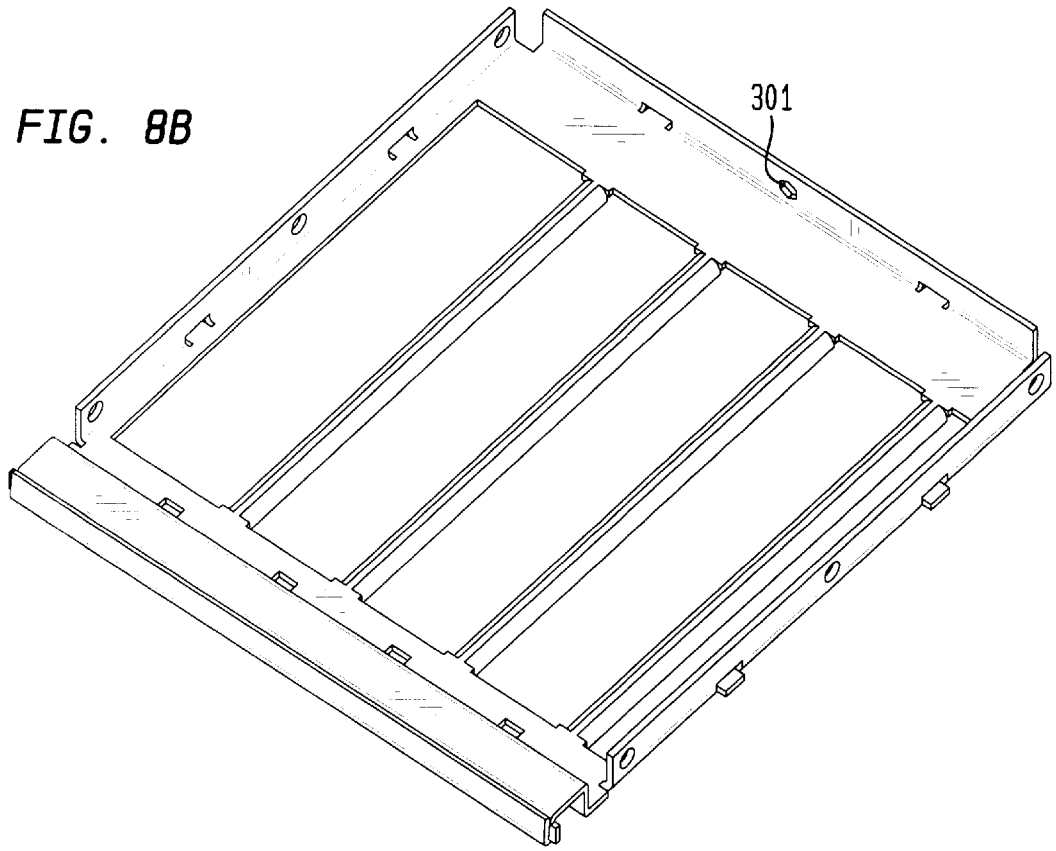
Figure 9A:
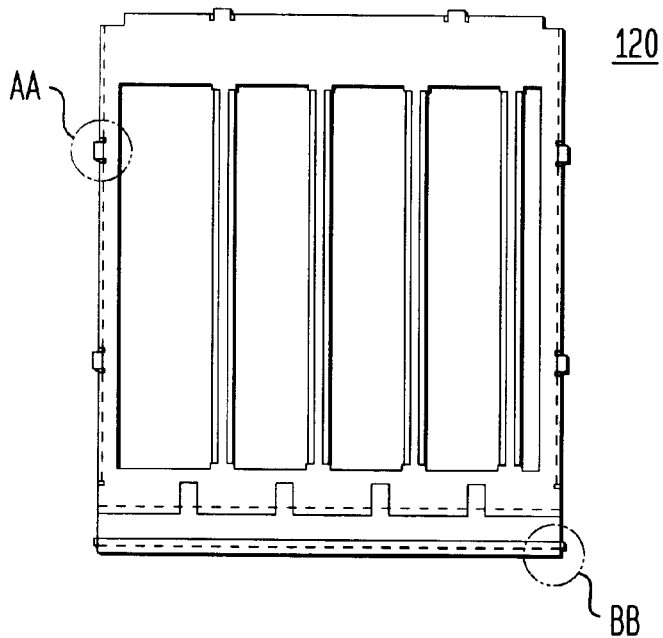
Figure 9B:
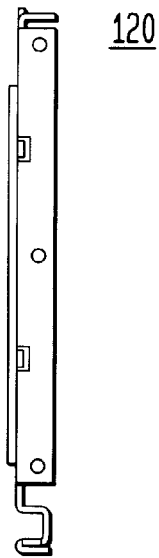
Figure 9C:
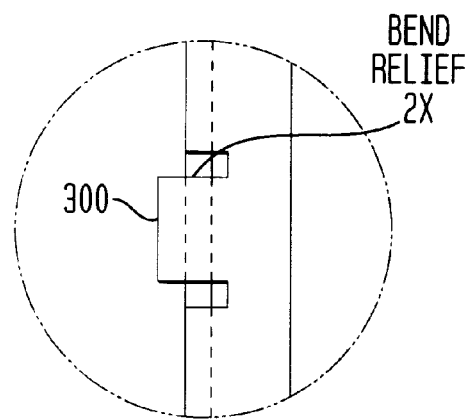
Figure 9C:
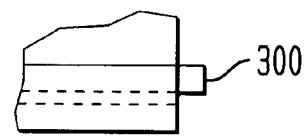

Referring specifically to FIGS. 8A and 8B, a front end 320 and a rear end 340 of bottom guide plate 120 is shown. Bottom guide plate 120 has tabs 300 that mate with slots 170 in test fixture body 130 and self-clinching flush fasteners 301 for locking bottom guide plate 120 to test fixture body 130. Specifically, top guide plate 110 is removably mounted at an upper end of test fixture body 130 and bottom guide plate 120 is removably mounted at lower end of test fixture body 130. Each guide plate is mounted between first side section 205, second side section 207 and back section 210. Tabs 300 have a built-in flexibility and are best illustrated in FIGS. 9C and 9D. Front end 320 of Bottom guide plate 120 further includes tracks 305 that run from front end 320 to rear end 340. A circuit pack is slidably and removably engaged or positioned between tracks 305 on top guide plate 110 and tracks 305 on bottom guide plate 120. A substantially unshaped latching channel 310 runs perpendicular to and is integrally formed with tracks 305. As a circuit pack is positioned onto tracks 305, latching channel 310 acts as a stop wall against which the circuit pack is locked. Latching channel 310 is best illustrated in FIGS. 9A and 9B, which show a top and side view of bottom guide plate 120. In addition to acting as a stop wall, the u-shaped channel permits easy removal and insertion of the guide plates. As a result of the integrated design, each guide plate can be formed from a single piece of sheet metal. This results in less pieces, eliminates tolerance build-up, increases ease in manufacturing and assembly of the guide plates and decreases the cost of the test fixture. Importantly, the one piece design permits the test engineers to easily change the spacing between the tracks to accommodate wider circuit packs with no loss in accuracy and alignment. That is, guide plates with different track spacings can be constructed and placed within test fixture body 130 with greater efficiency and less expense.

Figure 10:
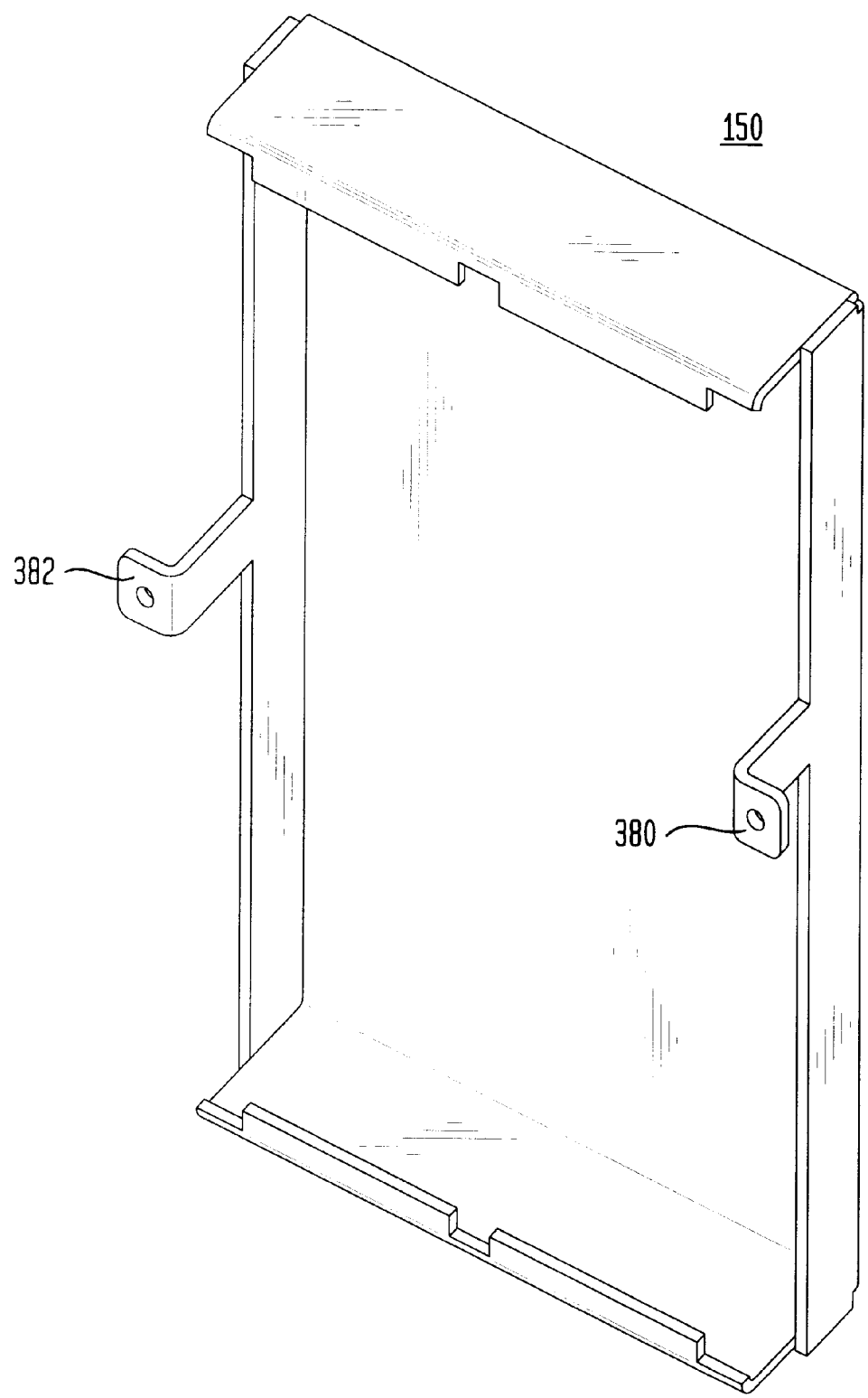
FIG. 10 is a perspective view of an exemplary embodiment of a cover bracket in accordance with the present invention (for 3N)

Referring now to FIG. 10, cover bracket 150 is shown. Cover bracket 150 is a polycarbonate cover enclosure that protects the pins in backplane 140 from damage. Cover bracket 150 is a substantially rectangular construct that includes a pair of mounting ears 380 and 382, which are offset in the same manner as cover mounting ears 180 and. 182. This offset relationship is best illustrated in FIGS. 11A and 11B, which show front and side view of cover bracket 150.

Figure 12:
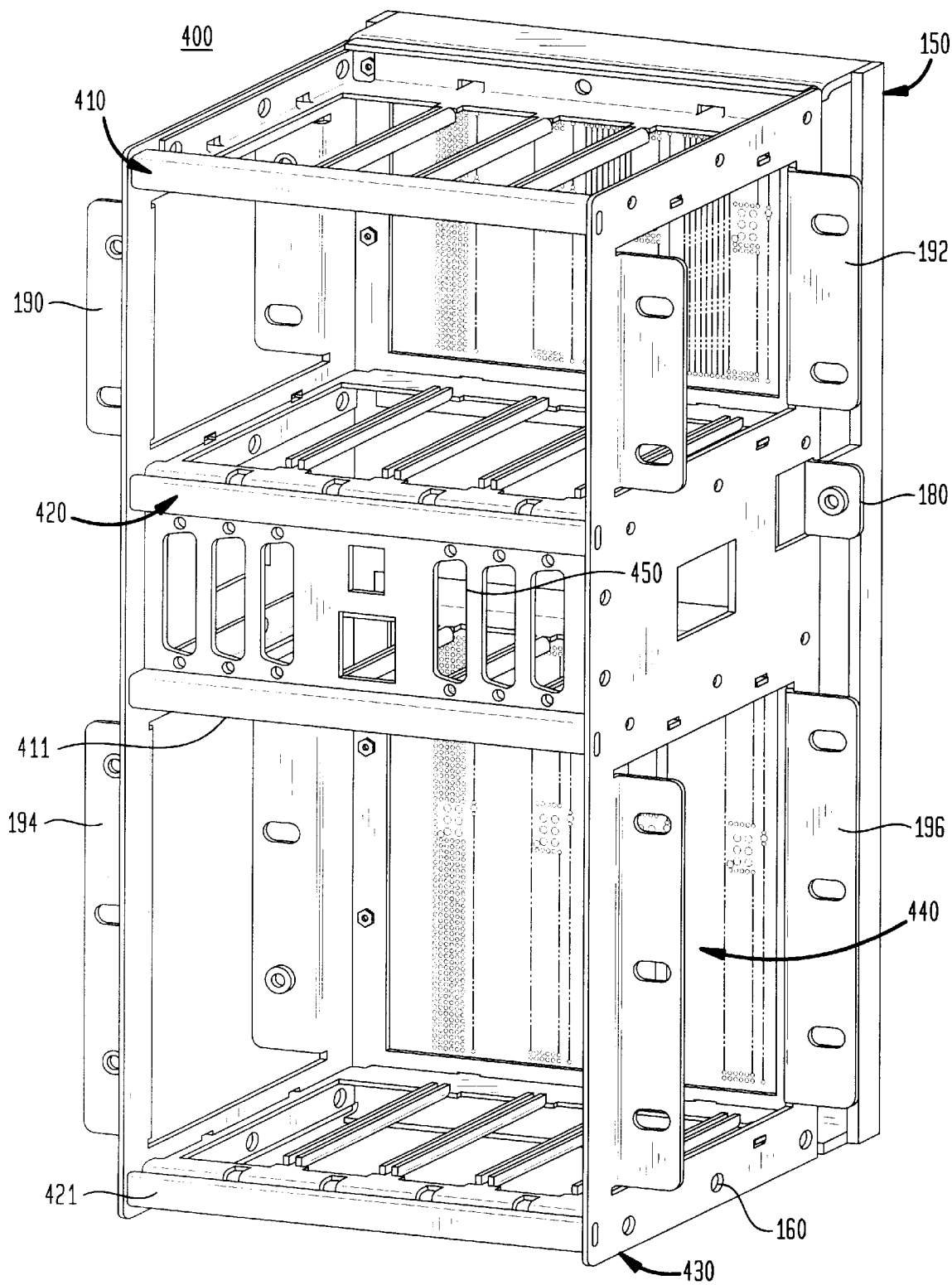
FIG. 12 is a perspective view of an exemplary embodiment of a test fixture for a 1N/1.5N size circuit pack with knockout patterns for transforming this fixture to accommodate 3N size circuit packs in accordance with the present invention.

Referring now to FIG. 12, there is shown an exemplary embodiment of a test fixture 400 for a 1N/1.5N/3N size circuit packs. Features identical to those presented above for test fixture 100 are represented with the same numbers and are not repeated here for sake of clarity. However, it should be noted, test fixture 400 can easily be fabricated by using knockout patterns in the sheet metal chassis to transform it to a 3N design and therefore we designate this embodiment as 1N/1.5N/3N. Test fixture 400 includes a pair of top guide plates 410, 411, a pair of bottom guide plates 420, 421, a test fixture body 430, a backplane 440 and a cover bracket 150. Test fixture 400 further includes an interface bracket assembly 450. Top guide plate 410 and bottom guide plate 421 are aligned and attached to test fixture body 430 in the same manner as before. Top guide plate 411 and bottom guide plate 420 are aligned with intermediate slots on test fixture body 430 and are attached with screws 160. As such, test fixture 400 has a two tiered design that can simultaneously accommodate 1N and 1.5N sized circuit packs.

Figure 13:
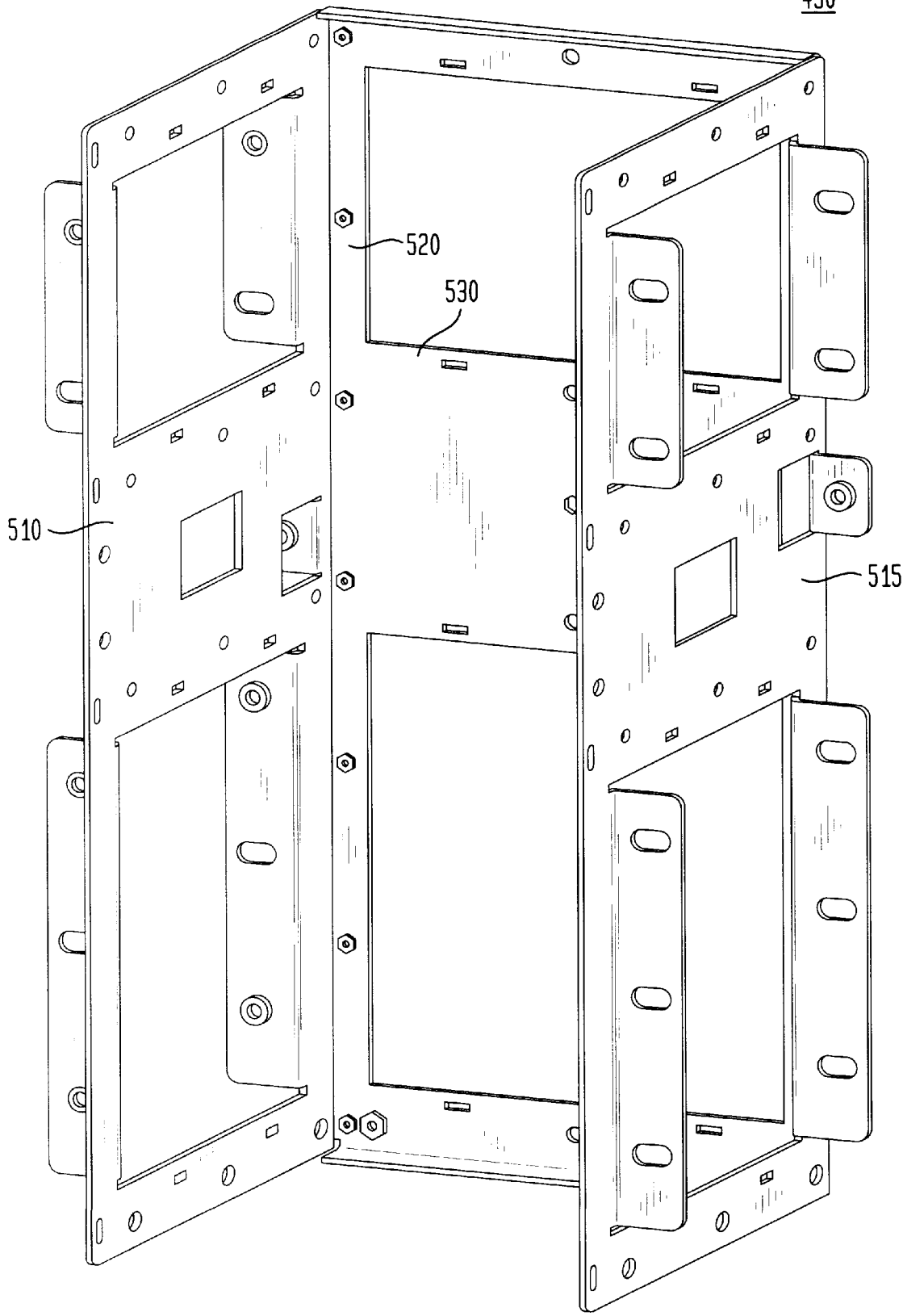
FIG. 13 is a front view of the exemplary embodiment shown in FIG. 12.

Referring now to FIG. 13, there is shown a test fixture body 430 in a standalone view. Test fixture body 430 includes a first side section 510, a second side section 515, and a back section 520. Back section 520 has a middle section 530 that is used for aligning and attaching top guide plate 411 and bottom guide plate 420. Middle section 530 is preferably fabricated as a punch-out section that allows for easy conversion between test fixture 100 and test fixture 400. This permits a single test fixture to be utilized for three different sized circuit packs.

Figure 14:
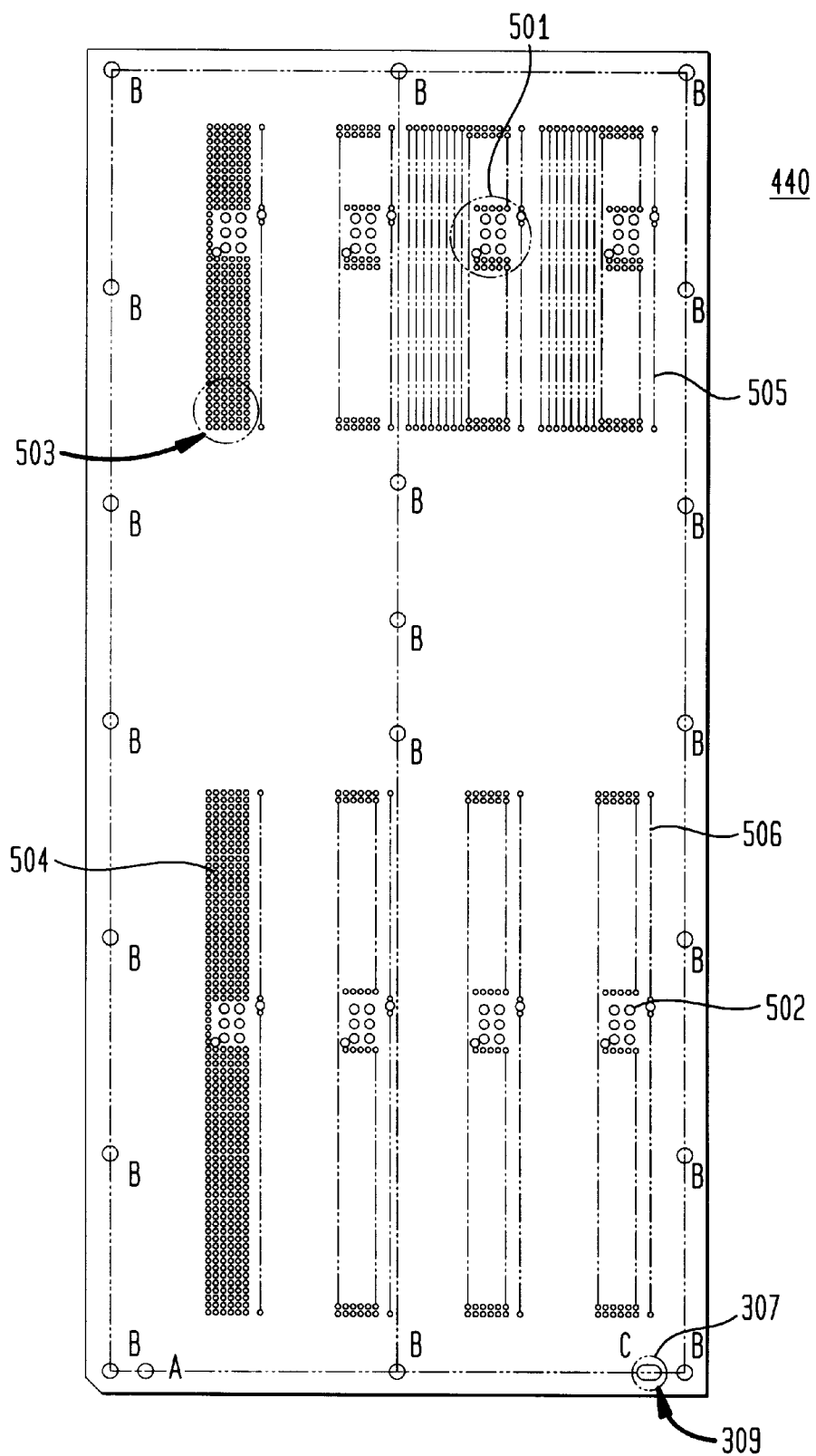
FIG. 14 is a side view of the exemplary embodiment shown in FIG. 12.

Referring now to FIG. 14, an exemplary embodiment of backplane 440 is shown for the 1N/1.5N/3N circuit pack. As before, backplane 440 is populated with METRAL® type connectors for connection with the circuit packs and the fiber-optic cables. As would be known to one skilled in the art, connectors 501, 502 are keying and alignment pin fields, connectors 503, 504 are single pin fields and connectors 505, 506 are the shield terminator pin fields. As shown, backplane 440 is configured to support both 1N and 1.5N sized circuit packs.

Figure 15:
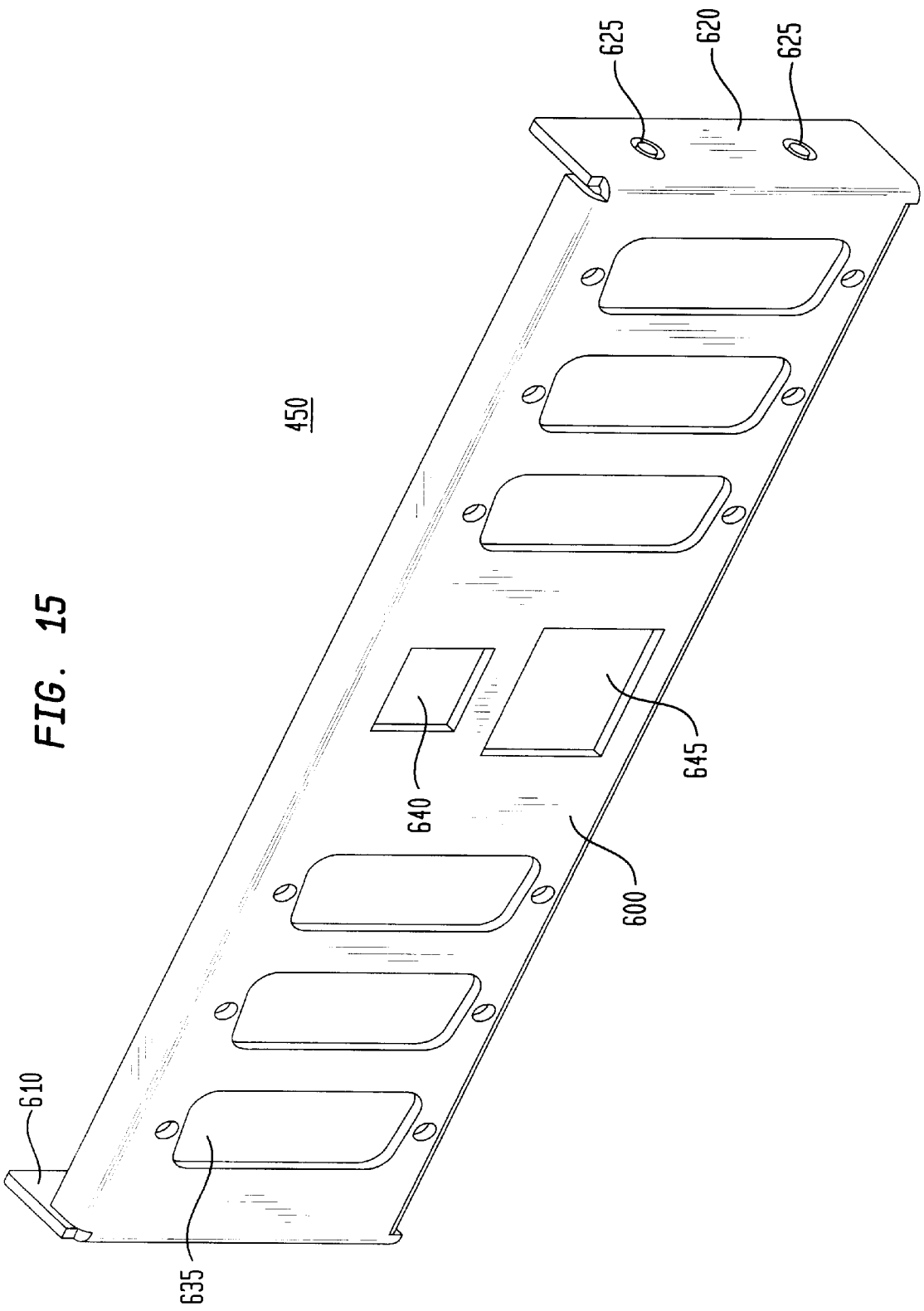
FIG. 15 is a perspective view of an exemplary embodiment of a test fixture body for a 1N/1.5N/3N size circuit pack in accordance with the present invention.

Referring now to FIG. 15, an interface bracket assembly 450 is shown. Interface bracket assembly 450 is a substantially rectangular construct that includes a front section 600, a first side section 610 and a second side section 620. First side section 610 and second side section 620 include self-clinching flush fasteners 625 that are used for attaching assembly 450 to first side section 205 and second side section 207 at an end opposite back section 210. Front section 600 of interface bracket assembly 450 further includes additional connector openings 635, 640, and 645 for connecting additional interface cables.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. A universal test fixture assembly with a pin-connector backplane which accepts circuit packs of varying width and heights for testing, comprising:
    a test fixture body, said test fixture body having a first side section, a second side section and a back section connecting said first side section and said second side section and supporting the pin-connector backplane; and
    a top guide plate and a bottom guide plate, each including:
        a front end and a second end;
        a plurality of tracks running from said front end to said second end;
        a latching channel at said front end, said latching channel running perpendicular to said plurality of tracks, said latching channel being integrally formed with said plurality of tracks;
    said top guide plate being removably mountable between said first side section, said second side section and said back section at a upper end of said test fixture body; and
    said bottom guide plate being removably mounted between said first side section, said second side section and said back section at a lower end of said test fixture body,
    wherein said top guide plate and said bottom guide plate are in an opposing and matching relationship such that at least one circuit pack slidably engages one of said plurality of tracks in said top guide plate and a corresponding track in said bottom guide plate to accommodate circuit packs of varying widths and heights.

2. The test fixture assembly according to claim 1, wherein:
    said first side section, said second side section, said back section include slots; and
    said top guide plate and said bottom guide plate include tabs,
    wherein said tabs on said top guide plate and said bottom guide plate are aligned with said slots on said first side section, said second side section, said back section to reduce tolerance build-up in said test fixture assembly.

3. The test fixture assembly according to claim 2, wherein said first side section and said second side section each include a pair of test fixture mounting ears that extend outwardly and perpendicular from said test fixture body for connecting said test fixture assembly with another test fixture assembly.

4. The test fixture assembly according to claim 3, wherein said first side section and said second side section are arranged to provide access by an operator to said circuit pack.

5. The test fixture assembly according to claim 4, wherein said pin-connector backplane has a plurality of connectors for engaging said circuit packs and cables, said backplane being mounted to said back section of said test fixture body.

6. The test fixture assembly according to claim 5, further including:
    a first cover mounting ear extending outwardly and perpendicular from said first side section;
    a second cover mounting ear extending outwardly and perpendicular from said second side section, said first cover mounting ear being in an offset relationship with said second cover mounting ear; and
    a cover bracket for enclosing said backplane, said cover bracket having a pair of mounting ears aligning with and affixing to said first cover mounting ear and said second cover mounting ear.

7. The test fixture assembly according to claim 6, wherein said cover bracket is made from polycarbonate.

8. The test fixture assembly according to claim 3, wherein the pin-connector backplane is a common pin-connector backplane that spans said test fixture assembly and said another test fixture assembly.

9. The test fixture assembly according to claim 1, further including:
    a second top guide plate and a second bottom guide plate, each including:
        a front end and a second end;
        a plurality of tracks running from said front end to said second end;
        a latching channel at said front end, said latching channel running perpendicular to said plurality of tracks, said latching channel being integrally formed with said plurality of tracks;
    said second bottom guide plate being removably mounted between said first side section, said second side section and said back section at an upper intermediate position on said test fixture body; and
    said second top guide plate being removably mounted between said first side section, said second side section and said back section at a lower intermediate position on said test fixture body,
    wherein said top guide plate and said second bottom guide plate and, said second top guide plate and said bottom guide plate are in opposing and matching relationships such that a first circuit pack size slidably engages one of said plurality of tracks in said top guide plate and a corresponding track in said second bottom guide plate and that a second circuit pack size slidably engages one of said plurality of tracks in said second top guide plate and a corresponding track in said bottom guide plate.

10. The test fixture assembly according to claim 9, wherein:
    said first side section, said second side section, said back section include slots; and
    said top guide plate, said second top guide plate, said bottom guide plate and said bottom guide plate include tabs,
    wherein said tabs on said top guide plate, said second top guide plate, said bottom guide plate and said second bottom guide plate are aligned with said slots on said first side section, said second side section, said back section to reduce tolerance build-up in said test fixture assembly.

11. The test fixture assembly according to claim 10, wherein said first side section and said second side section each include a pair of test fixture mounting ears that extend outwardly and perpendicular from said test fixture body for connecting said test fixture assembly with another test fixture assembly.

12. The test fixture assembly according to claim 11, wherein said first side section and said second side section are arranged to provide access by an operator to said circuit pack.

13. The test fixture assembly according to claim 12, wherein said pin-connector backplane has a plurality of connectors for engaging said first circuit pack size and said second circuit pack size and cables, said pin-connector backplane being mounted to said back section of said test fixture body.

14. The test fixture assembly according to claim 1, further including:
   a first cover mounting ear extending outwardly and perpendicular from said first side section;
   a second cover mounting ear extending outwardly and perpendicular from said second side section, said first cover mounting ear being in an offset relationship with said second cover mounting ear; and
   a cover bracket for enclosing said pin-connector backplane, said cover bracket having a pair of mounting ears aligning with and affixing to said first cover mounting ear and said second cover mounting ear.

15. The test fixture assembly according to claim 14, wherein said cover bracket is made from polycarbonate.

16. The test fixture assembly according to claim 15, further including an interface bracket assembly for providing additional access to said first circuit pack size and said second circuit pack size, said interface bracket assembly having a first side and a second side, said first side and said second side being connected to said first side section and said second side section at an end opposite said back section and being positioned between said second top guide plate and said second bottom guide plate.

17. A housing for circuit packs of varying widths and heights, comprising:
   a test fixture body, said test fixture body having a pair of parallel sides and a back section connecting said parallel sides;
   a pair of guide plates, each including:
      a front end and a second end;
      at least one track extending from said front end to said second end;
      a latching channel at said front end, said latching channel running perpendicular to said at least one track, said latching channel being integrally formed with said at least one track;
   one of said guide plates being removably mounted between said parallel sides and said back section at one end of said test fixture body; and
   another one of said guide plates being removably mounted between said parallel sides and said back section at an opposite end of said test fixture body,
   wherein said guide plates are mounted in an opposing and matching relationship such that a circuit pack slidably engages said at least one track in said one of said guide plates and a corresponding track in another one of said guide plates to accommodate circuit packs of varying sizes.

18. The housing according to claim 17, wherein:
   said parallel sides and said back section include slots; and
   said pair of guide plates include tabs,
   wherein said tabs on said guide plates are aligned with said slots on said parallel sides and said back section to reduce tolerance build-up in said housing.

19. The housing according to claim 18, further including:
   a second pair of guide plates, each including:
      a front end and a second end;
      at least one track extending from said front end to said second end;
      a latching channel at said front end, said latching channel running perpendicular to said at least one track, said latching channel being integrally formed with said at least one track;
   one of said second pair of guide plates being removably mounted between said parallel sides and said back section at an intermediate end on said test fixture body; and
   another one of said second pair of guide plates being removably mounted between said parallel sides and said back section at an opposite intermediate end on said test fixture body,
   wherein said one of said pair of guide plates and said one of said second pair of guide plates are in opposing and matching relationships to form a first tier, and said another of said pair of guide plates and said another of said second pair of guide plates are in opposing and matching relationships to form a second tier, said first tier slidably engaging a first circuit pack size and said second tier slidably engaging a second circuit pack size.

20. The house according to claim 19, further including an interface bracket assembly for providing additional access to said first circuit pack size and said second circuit pack size, said interface bracket assembly having a first side and a second side, said first side and said second side being connected to said parallel sides at an end opposite said back section and being positioned between said first tier and said second tier.

21. The housing according to claim 20, further including:
   a pair of cover mounting ears extending outwardly and perpendicular from each of said parallel sides, wherein one of said pair of cover mounting ears is in an offset relationship with another one of said pair of cover mounting ears; and
   a cover bracket for enclosing a backplane, said cover bracket having a pair of mounting ears aligning with and affixing to said pair of cover mounting ears.

22. The housing according to claim 20, wherein each side of said pair of parallel sides includes a pair of test fixture mounting ears that extend outwardly and perpendicular from said test fixture body for connecting said housing for circuit packs with another housing for circuit packs.

23. The housing according to claim 22, further including a backplane that spans said housing for circuit packs and said another housing for circuit packs.

* * * * *